(12) United States Patent  (10) Patent No.: US 7,813,161 B2
Luthra  (45) Date of Patent: Oct. 12, 2010

(54) DUAL PORT SRAM WITH DEDICATED READ AND WRITE PORTS FOR HIGH SPEED READ OPERATION AND LOW LEAKAGE

(75) Inventor: Yogesh Luthra, Indirapuram (IN)

(73) Assignee: STMicroelectronics Pvt. Ltd, Greater Noida (UP) (IN)

( * ) Notice: Subject to any disclaimer, the term of this patent is extended or adjusted under 35 U.S.C. 154(b) by 320 days.

(21) Appl. No.: 11/847,119

(22) Filed: Aug. 29, 2007

(65) Prior Publication Data

US 2008/0089145 A1  Apr. 17, 2008

(30) Foreign Application Priority Data

Aug. 30, 2006  (IN)  .................. 1947/DEL/2006

(51) Int. Cl.
*G11C 13/00*  (2006.01)
(52) U.S. Cl. .............. 365/154; 365/189.15; 365/189.14
(58) Field of Classification Search ................. 365/154, 365/189.15, 189.16
See application file for complete search history.

(56) References Cited

U.S. PATENT DOCUMENTS 7,701,801 B2* 4/2010 Joshi et al. ............. 365/230.08

2006/0215465 A1* 9/2006 Bhavnagarwala et al. ................................................. 365/189.12
2006/0274569 A1* 12/2006 Joshi et al. .................. 365/154
2007/0242498 A1* 10/2007 Chandrakasan et al. ..... 365/154
2007/0279966 A1* 12/2007 Houston ..................... 365/154

\* cited by examiner

*Primary Examiner*—Vu A Le
*Assistant Examiner*—Han Yang
(74) *Attorney, Agent, or Firm*—Hogan Lovells US LLP

(57) ABSTRACT

A dual port static random access memory (SRAM) having dedicated read and write ports provides high speed read operation with reduced leakages. The dual port SRAM includes at least one write word line, at least one read word line, at least one pair of write bit line and read bit line, a plurality of rows and columns. Each rows and column has at least one cell which includes at least one pair of memory elements cross-coupled to form a latch for storing data, a pair of write access semiconductors and a pair of read access semiconductors. The SRAM includes an inverter circuit and a pull down circuit which are operatively coupled to the at least one cell to increase read operation performance and eliminate leakage.

20 Claims, 6 Drawing Sheets

DUAL PORT SRAM WITH DEDICATED READ AND WRITE PORTS FOR HIGH SPEED READ OPERATION AND LOW LEAKAGE

RELATED APPLICATION

The present application claims priority of Indian Patent Application No. 1947/Del/2006 entitled DUAL PORT SRAM WITH DEDICATED READ AND WRITE PORTS FOR A HIGH SPEED READ OPERATION AND A LOW LEAKAGE, and filed Aug. 30, 2006, which is incorporated herein in its entirety by this reference.

FIELD OF THE INVENTION

The present invention relates to memory devices, and more specifically to a dual port static random access memory (SRAM) architecture providing a high speed read operation with reduced leakage.

BACKGROUND OF THE INVENTION

The necessity of supporting information processing needs have made memory devices and systems more and more complex and diversified. Moreover, it has become highly advantageous to execute read and write operations simultaneously. This has led to the advent of dual port memory, which provides two access ports (e.g., left and right ports) that can access a common memory array. Dual port memory allows one port to be used for a write operation even when the other port is being used for a read operation.

One type of basic storage memory is static random access memory (SRAM). The advantage of SRAM is that it does not require additional refresh, as it employs latch type cells. In additional, SRAM can retain its memory state without refreshing, as long as power is supplied to the cells.

Conventionally, one unit memory cell of a single port SRAM device is composed of six transistors, i.e., two load transistors, two drive transistors and two active transistors, to perform read and write operations sequentially. In contrast, a dual port SRAM device includes eight transistors, i.e., two load transistors, two drive transistors and four active transistors to perform the read and write operations in a dual mode.

FIG. 1 illustrates a circuit diagram 100 of a conventional single unit of dual port SRAM cell. It includes two load transistors 102 and 104, two drive transistors 106 and 108 and four active transistors 110, 112, 114 and 116. The two load transistors 102 and 104 and the two drive transistors 106 and 108 are individually connected to form two invertors. The two invertors are cross coupled so as to form a latch for storing data. The drain of the active transistor 110 is connected to a read bit line RBL, with the source is connected to the latch output node and the gate is connected to a read word line RWL. The drain of the active transistor 112 is connected to a complementary read bit line RBLB, the source is connected to the latch output node and the gate is connected to the read word line RWL. The drain of the active transistor 114 is connected to a write bit line WBL, the source is connected to the latch output node and the gate is connected to a write word line WWL. The drain of the active transistor 116 is connected to a complementary write bit line WBLB, the source is connected to the latch output node and the gate is connected to the write word line WWL.

Thus, there are two different ports through which read and write operations can be performed simultaneously. To read a particular data, a word line signal for read operation is enabled as logic low 'L'. As a result, the two active transistors 110 and 112 are turned on and the data stored at the latch is read through the read bit line RBL and the complementary bit line RBLB. In the case of write operation, a word line signal for a write operation is enabled as logic high 'H'. The transistors 114 and 116 are turned on and the data loaded on the bit line and the complementary bit line is stored at the latch.

However, as seen from FIG. 1, there is an interaction between the read and write operations if both the read and the write word lines are on simultaneously. This results in crosstalk and brings about a characteristic drop in the dual port SRAM cell. This drawback can be minimized by tuning write and read pass transistors so as to benefit one operation more at the expense of other, while still maintaining a somewhat robust configuration. However, this defeats the very purpose of dual port SRAM, i.e., the ability to perform simultaneously the read and write operations. Moreover, to reduce static leakage of the cell, all transistors are doped with high Vt layer in sub nanometer technologies (CMOS 90 nm onwards). This results in further degradation of speed as pass gates and latch NMOS transistors come in series both with high Vt implant.

To overcome the above identified problems, another circuit 200 was designed, in which the gate of the active transistors 202 and 204 are connected to the output of the latch and a source of the transistors are connected to a read enable control signal RE as illustrated in FIG. 2. In this way, the interaction between the read and write operations are eliminated. However, this method presents another problem, in that the read enable RE has to drive all the bit lines and that requires a very wide metal line for RE (to eliminate risk of electro migration) as illustrated in FIG. 3. As the size of the metal line is very wide, the metal line will not fit into a memory cell's height. Also, due to huge current flowing in RE line, there is a rise in the voltage level of this signal which severely impacts performance of the last column (as the rise will be the maximum in the last column).

However, if the memory using the above scheme is self-timed, leakage on bit lines of unselected rows can be eliminated. Read pass transistors then need to be made as large as possible considering area constraint, and write flip time as capacitance on internal nodes increases. In addition, the size of a pull down NMOS driving the RE to ground needs to be very big, which causes a big static power loss (as this pull down will have Vds=Vdd available).

In order to overcome the problem of having very wide metal line for RE, another circuit 400 can be used, in which the sources of the active transistors 402 and 404 are connected to the ground through a pull down transistor 406 as illustrated in FIG. 4. The sources of the active transistors 402, 404 are connected to the ground through the pull down transistor 406. The pull down transistor 406 will pull down the voltage of the signal. This method can be used for memories not employing self-time. However, this cell will be asymmetric with respect to center (where PMOS transistors will be made in N-well). Also, it suffers from dynamic leakage on bit lines. A larger size of the pass gate, will result in larger dynamic leakage. The magnitude of the static leakage is less as compared to the methods discussed above. In this case area requirement in memory cell is also higher which is somewhat compensated due to lesser decoder area than previous schemes. However, the overall area will be higher as there is a discrete pull down in every cell.

FIG. 5 illustrates a method to obtain a high performance by using a logic implant in a SRAM. Four NMOS transistors 502, 504, 506 and 508 are connected to a SRAM implant to perform a read operation. The drain of the NMOS transistor 502 is connected to the read bit line RBL, the source of NMOS transistor 502 is connected to the drain of NMOS transistor 504. The gate of NMOS transistor 502 is connected to the read word line RWL. The gate of the NMOS transistor 504 is connected to the output of the latch and the source is at ground voltage. Similar connection is made for NMOS transistors 506 and 508. The logic implant performs the read operation. Thus, this cell does not suffer from asymmetric structure. However, as large numbers of gates are used in the memory cell itself, a large area is required, and dynamic as well as the static leakage of this cell will be even greater than the previous methods. If the threshold voltages of memory cell components are increased, the static power can be reduced. However, this will degrade the cell's performance drastically.

To improve read performance in the above configuration, only the read pass gates and corresponding pull downs are kept in logic thresholds, unfortunately at the expense of leakage. This needs to be done if the purpose of the cell is to be achieved, i.e., to a give high performance and if the area is not to be increased a lot. However, this structure suffers from risks arising due to mixing of logic and SRAM (relatively high threshold voltage devices) and requires a big area increase to follow normal Design Rules Checking (DRC) to separate logic and SRAM devices. Moreover, there is a reliability risk of repeated mixing of logic (low Vt) implant and SRAM (high Vt) implant.

The prior art discussed above does not overcome the major prevailing problems in the field of dual port SRAM for simultaneous read and write operations. Problems like lower speed due to interactions between read and write ports, a very wide metal line for read enable (RE) signal, static power loss due to big pull down transistor for RE, dynamic and static leakages, asymmetric structure and bigger area, etc., still persists. Thus, there remains a need for a novel SRAM architecture to provide a high speed read operation with reduced leakages.

SUMMARY OF THE INVENTION

According to the present invention a dual port static random access memory (SRAM) for high speed read operations is provided. The circuit and method of the present invention provides a dual port SRAM having low static leakages. The circuit and method of the present invention further provides a dual port SRAM utilizing a minimal cell area for easy cell fabrication.

The present invention provides a dual port SRAM having dedicated read and write ports to provide a high speed read operation with a low leakage. The SRAM of the present invention includes:
at least one write word line;
at least one read word line;
at least one pair of read and write bit lines;
a plurality of rows and columns, each of said rows and columns having at least one cell, the at least one cell comprising:
  at least one pair of memory element cross coupled to form a latch for storing data,
  a pair of write access semiconductor connected between said write bit line and latch output node of said memory element, said access semiconductors having a gate terminal connected to said write word line, and
  a pair of read access semiconductor connected between said read bit line and a local drive line, said access semiconductor having a gate terminal controlled by said latch output node,
at least one inverter circuit; and
a pull down circuit,
the at least one inverter circuit and pull down circuit being operatively coupled to the at least one cell to increase read operation performance and minimize leakage.

Further the present invention provides a method of providing a high speed read operation and a low leakage in a dual port SRAM including the steps of:
creating a bi-stable circuit in a pair of memory element for storing true and complement logic levels;
writing data with a write access semiconductor;
reading data with read access semiconductors having a source terminal connected to an inverter circuit for high speed operation; and
controlling a leakage with a leakage control signal, said signal being applied to a pull down circuit during an inactive mode of a memory cell.

DETAILED DESCRIPTION OF PREFERRED EMBODIMENTS

Figure 1:
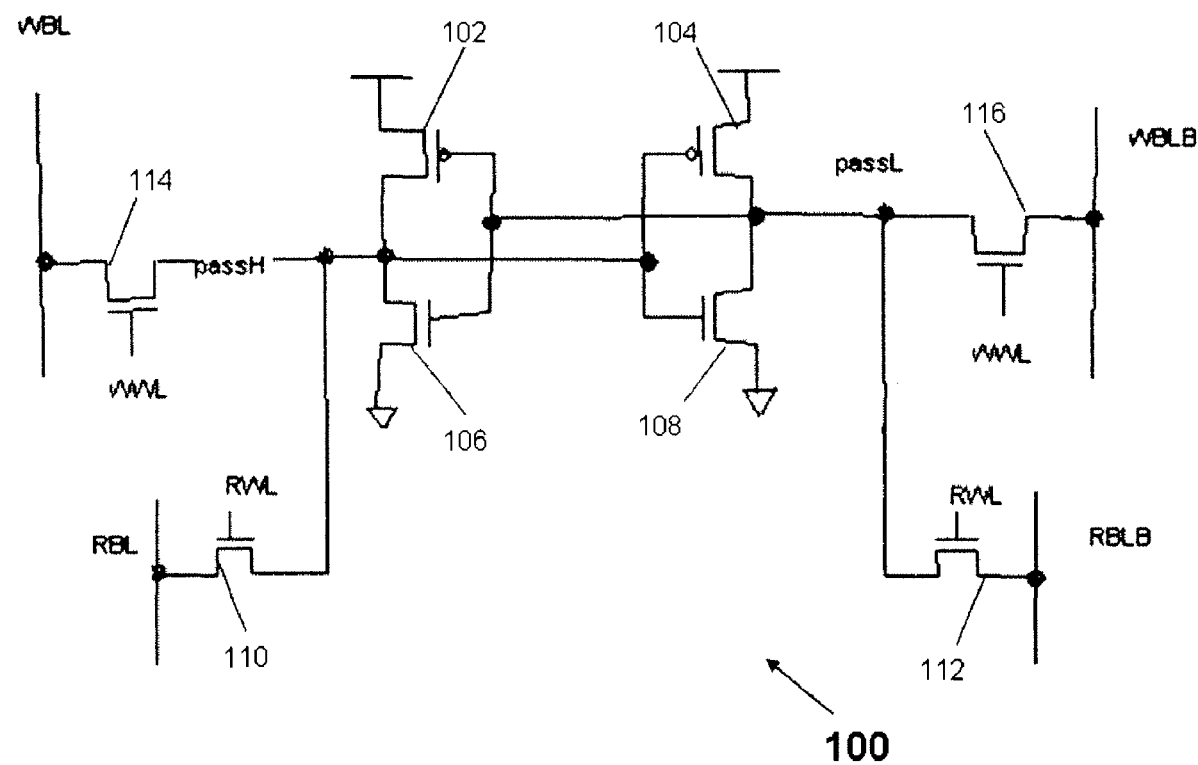
FIG. 1 illustrates a circuit diagram of a conventional dual port SRAM cell.

The preferred embodiments of the present invention will be described in detail with reference to the accompanying drawings. However, the present invention is not limited to the preferred embodiments. The present invention can be modified in various forms. The preferred embodiments of the present invention are only provided to explain more clearly the present invention to the ordinarily skilled in the art of the present invention. In the accompanying drawings, like reference numerals are used to indicate like components.

The present invention provides a SRAM architecture for high speed read operation with a dedicated read and write port with a minimal area. In the present invention, the dual port SRAM has an organized cell positioned in a plurality of rows and columns.

Figure 6:
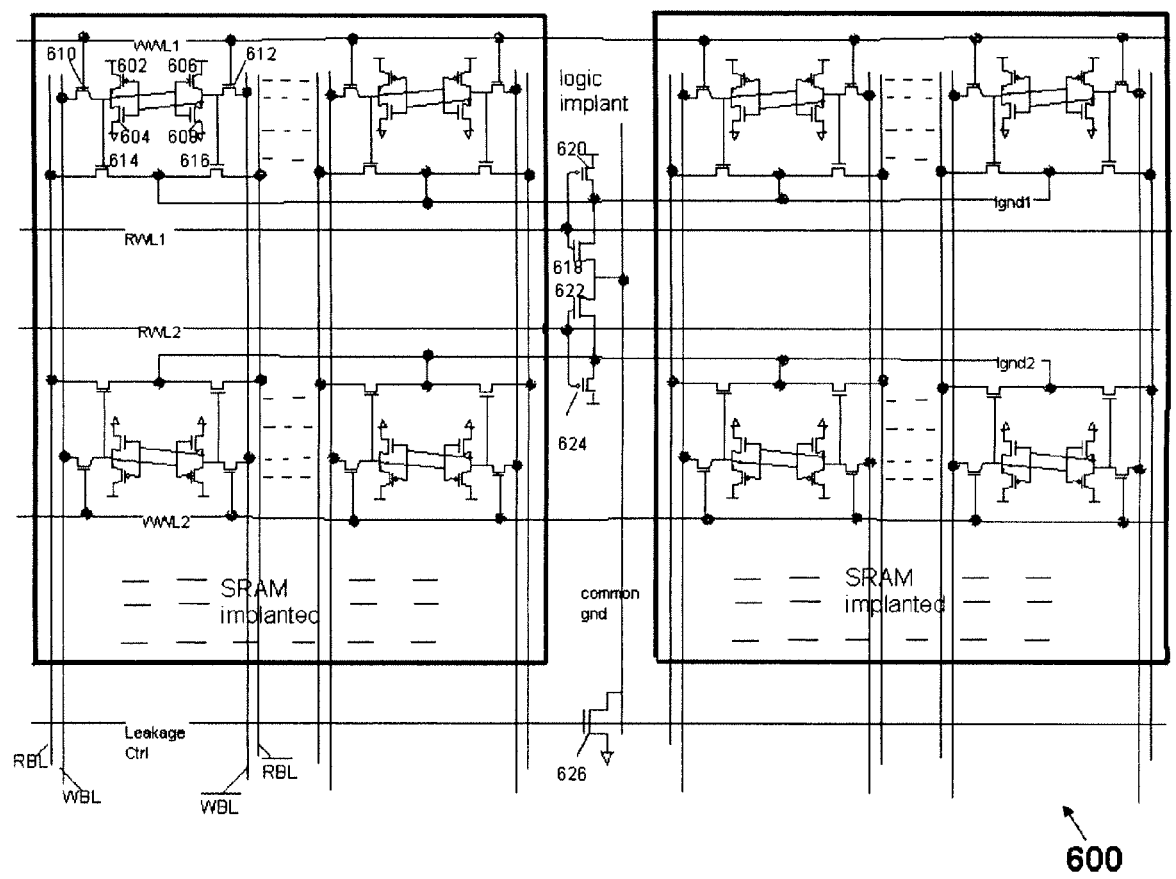
FIG. 6 illustrates an architecture for an SRAM array according to the present invention.

FIG. 6 illustrates an architecture for an SRAM array 600 according to the present invention. Dual port static random access memories (SRAM) having dedicated read and write ports. The SRAM array provides a high speed read operation with a low leakage.

The SRAM architecture 600 includes N memory cells wherein each cell includes of eight transistors implanted in an SRAM layer (high threshold layer). Each cell includes two PMOS pull up transistors 602 and 606, two NMOS pull down transistors 604 and 608 to form a normal latch portion.

The array 600 includes at least one write word line, at least one read word line, at least one pair of write bit line and read bit line with a plurality of rows and columns. Each rows and columns have at least one cell. The cell includes at least one pair of memory element cross coupled to form a latch for storing data, a pair of write access semiconductor 610, and 612 and a pair of read access semiconductors 614 and 616.

The write access semiconductors 610 and 612 include a NMOS transistor, such as NMOS transistor 610, NMOS transistor 612, having a gate terminal connected to write word line, a drain terminal connected to write bit line and a source terminal connected to latch output node. The read access semiconductor 614, and 616 includes a NMOS transistor, such as transistor 614, and transistor 616, having a gate terminal connected to latch output node of memory element, a drain terminal connected to read bit line and source terminal connected to local drive line. The SRAM array has at least one an inverter circuit and a pull down circuit 626. The inverter circuit includes a PMOS transistor, such as PMOS transistor 620, PMOS transistor 624, and an NMOS transistor, such as NMOS transistor 618, NMOS transistor 622, placed at the centre of the array of cells. The pull down circuit includes at least one NMOS transistor 626 having a drain terminal connected to the inverter, a source terminal connected to a ground voltage, and a gate terminal receiving a leakage control signal to reduce said leakages during inactive mode of memory by turning off the NMOS 626 of the pull down circuit.

As each cell of array 600 is SRAM implanted, the core portion containing the unit cell is purely in high threshold region. A locally generated signal, local ground (lgnd), is shared between N numbers of cells. The lgnd signal is driven low by the NMOS transistor 618 or 622, which is placed at the center of the N cell array. Making the origin of local ground at the center of array also halves the maximum current driven by the NMOS transistor 618 or 622. This in turn halves the width of local ground line required to minimize electro migration. The pull down NMOS transistors 618 and 622 are logic implanted (low threshold), so a large size will not be required to drive N bit lines. However, the number of cells depends on the maximum current the local ground is allowed by the electro migration rules. As the number of cells increases, the current on local ground also increases and hence more width will be required. The lgnd signal is pulled up by the PMOS transistors 620 or 624 to eliminate load cells leakage. These SRAM implanted devices have high thresholds (for 65 nm LPSVT it is around 480 mV), so that when a memory is self timed for a maximum drop of 70 mV on bit lines, load cells will not interfere in the normal operation. The PMOS transistors 620 and 624 should be tuned in such a way to raise a local ground voltage above (Vdd–Vt) (read pass gate) in maximum 3-4 cycles. Otherwise there would be a charge sharing between a bit line and 4 local grounds, and even a small charge sharing can kill the voltage difference between the bit lines. There is a vertical line named common ground, running vertically and connected to the sources of the shared pull down transistors 618 and 622. The vertical line is connected to the drain of the pull down NMOS transistor 626 at the bottom of core. The NMOS transistor 626 is controlled by a leakage control signal that turns off the transistor 626 during an inactive mode.

This core structure, when used in the development of the dual port SRAM architecture, results in around 30% improvements in access time as compared to the conventional 8-transistor dual port cell as illustrated in FIG. 1 (in CMOS 065 nm technology in LPSVT option). A core area of the present scheme is 14% higher than a conventional dual port core.

Figure 2:
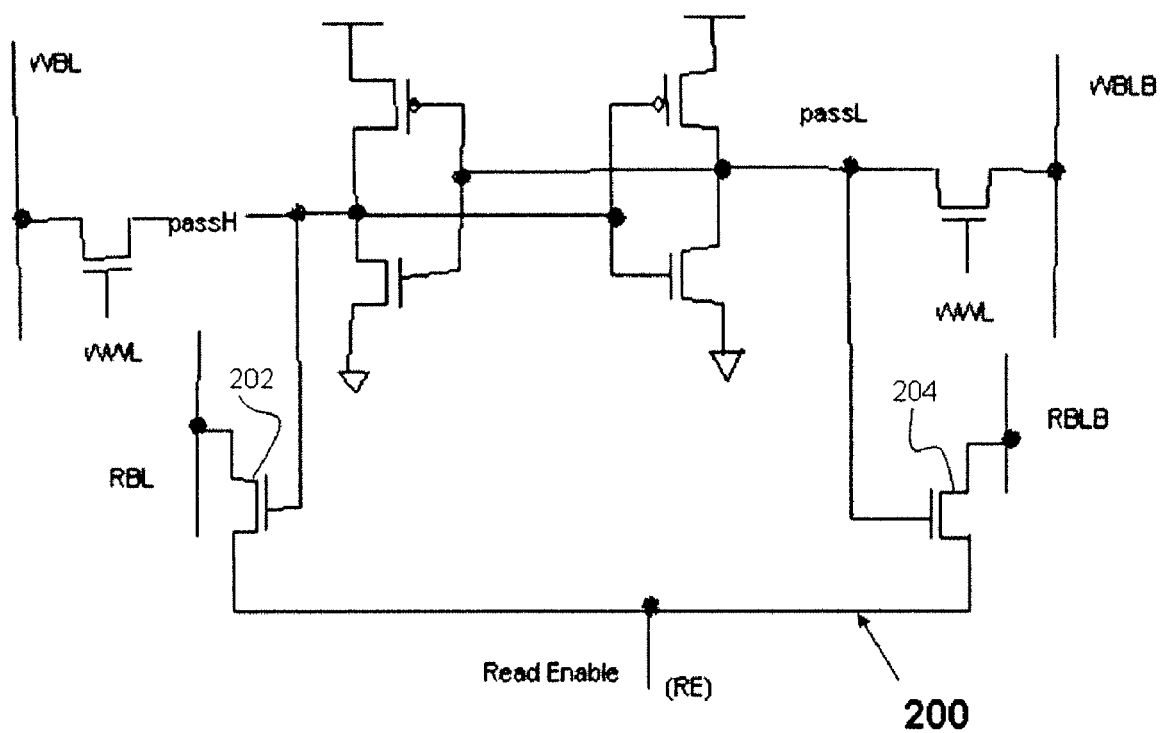
FIG. 2 illustrates a circuit diagram of a conventional dual port SRAM cell with internal nodes on gates of read pass gates.
Figure 3:
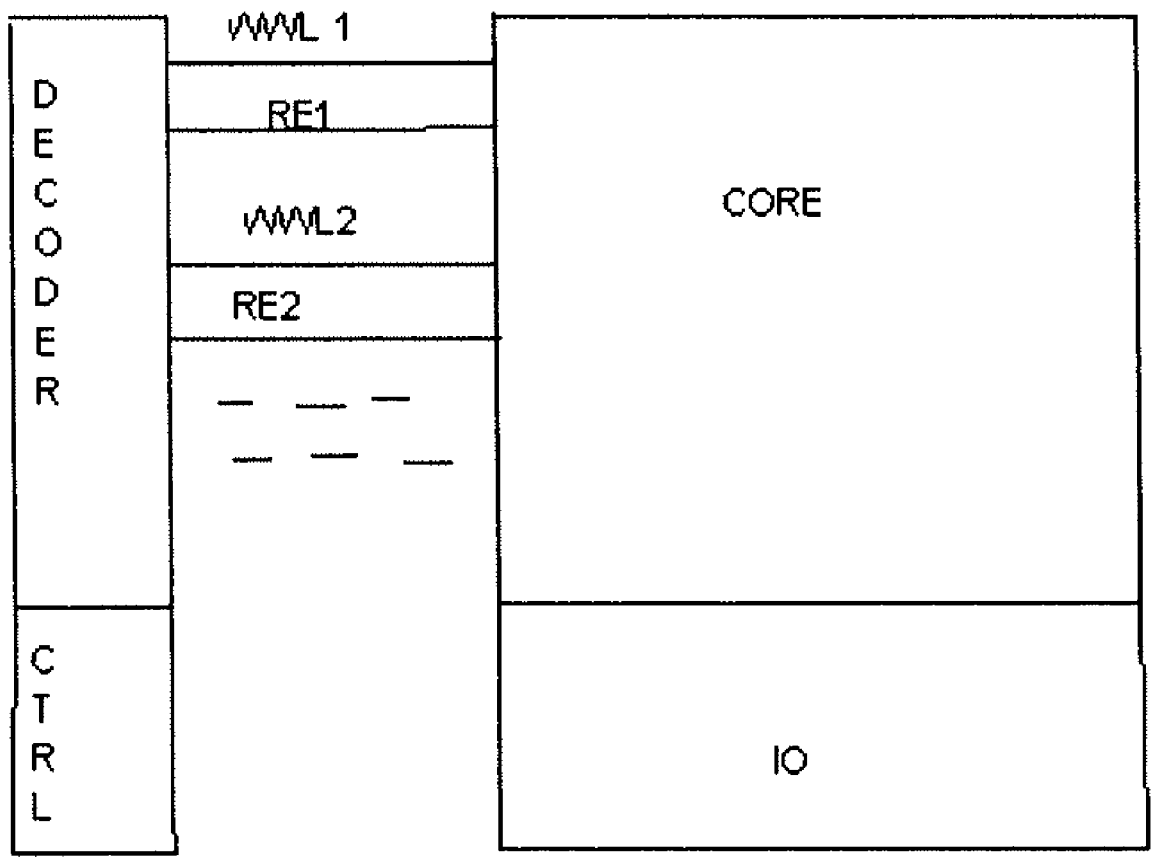
FIG. 3 illustrates a connection diagram between a memory core and peripheral devices according to the prior art mentioned in FIG. 2.
Figure 4:
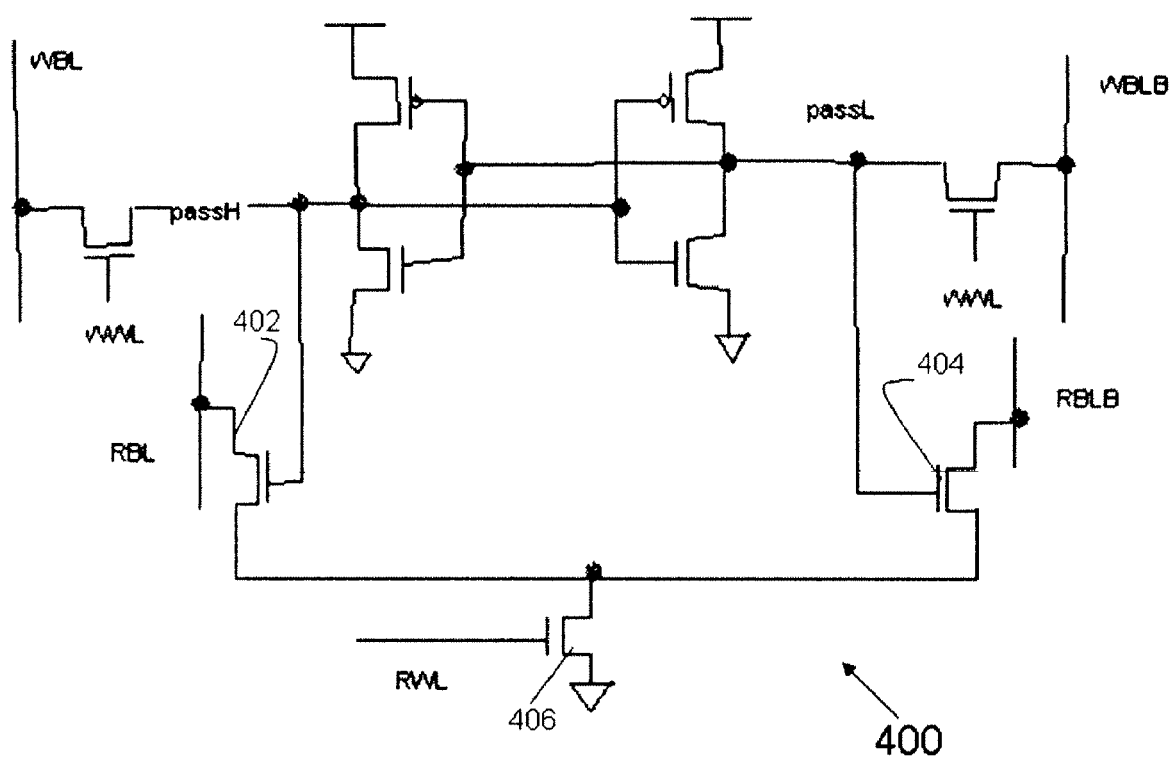
FIG. 4 illustrates a circuit diagram of a conventional dual port SRAM cell having a pull down transistor.
Figure 5:
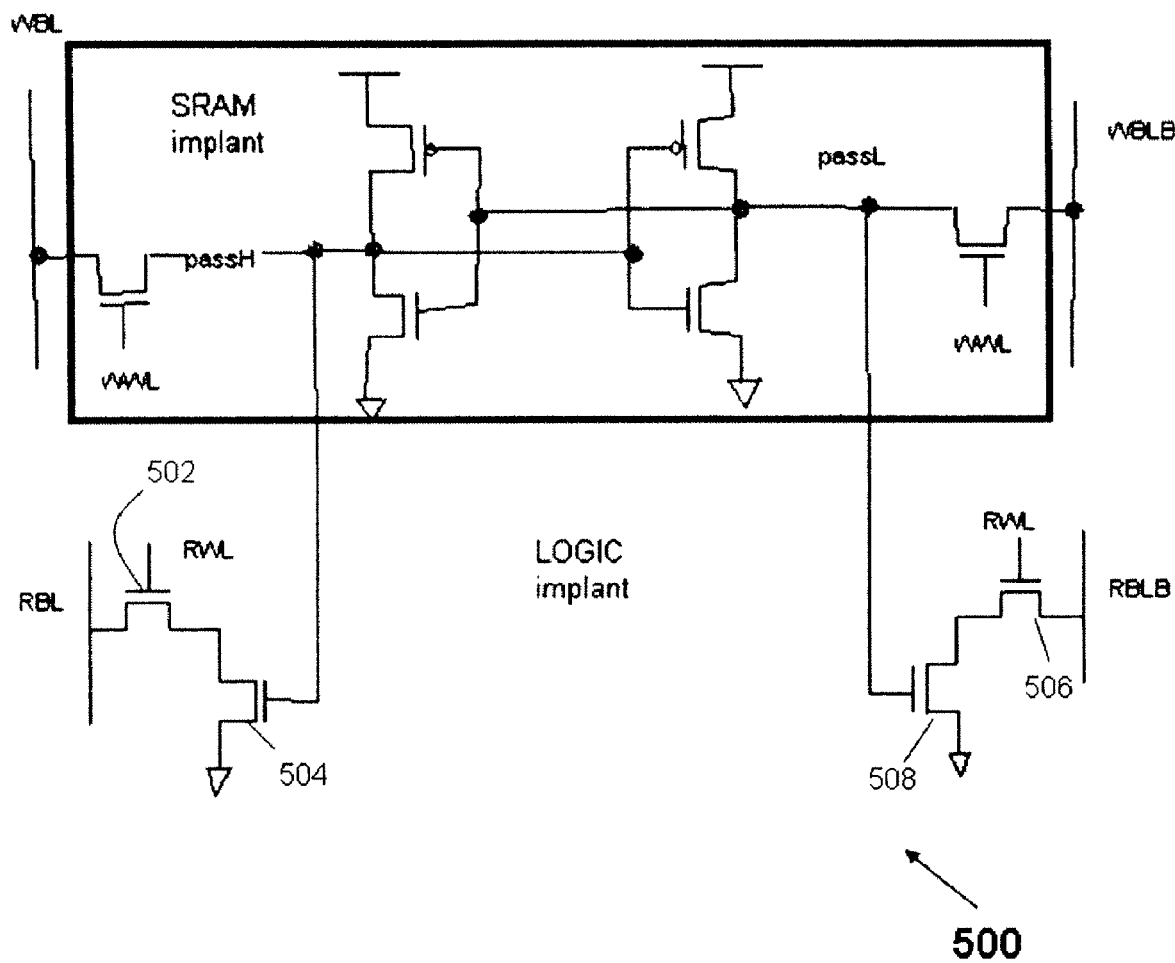
FIG. 5 illustrates a circuit diagram of a conventional dual port SRAM cell with a logic implant.

The architecture described in the present invention offers many advantages. First, the SRAM layer need not be broken in every cell and is continuous with breaks only after certain number of cells. This causes minimum area loss to reduce leakages, while achieving a high speed. Second, the width requirement of local grounds is kept under control by limiting the number of cells sharing the pull down NMOS transistors. As the pull down NMOS transistors are kept at the center of the array of cells, sharing local ground, width requirement further reduces down by half. Third, the sharing of the pull down NMOS transistors between more cells further reduces the core area. Fourth, as the local grounds are generated locally, the problem of rising ground level for last column sharing this line, as existed in the method illustrated by FIG. 2, will not arise. Fifth, the small pull ups charge the local grounds in maximum 3-4 cycles, as a result the load cells will not leak for a self timed memory tuned for a voltage difference of around 70-80 mV, which minimizes a voltage difference loss in the differential bit line sensing scheme. Sixth, shared vertical lines (common grounds) are connected to sources of the shared pull down transistors 618 and 620, and to the drain of an NMOS transistor 626 at the bottom of the core, controlled by a leakage control signal, can reduce the leakage during inactive mode by pulling down this leakage control signal.

Although the disclosure of system and method has been described in connection with the embodiment of the present invention illustrated in the accompanying drawings, it is not limited thereto. It will be apparent to those skilled in the art that various substitutions, modifications and changes may be made thereto without departing from the scope and spirit of the disclosure.

I claim:

1. A dual port static random access memory (SRAM) having dedicated read and write ports to provide a high speed read operation with a low leakage comprising:
    at least one write word line;
    at least one read word line;
    at least one pair of read and write bit lines;
    a plurality of rows and columns, each of said rows and columns having at least one cell, the at least one cell comprising:
        at least one pair of memory elements cross-coupled to form a latch for storing data,
        a pair of write access transistors connected between said write bit line and a latch output node of said memory element, said pair of write access transistors having a gate terminal connected to said write word line, and
        a pair of read access transistors connected between said read bit line and a local drive line, said pair of read access transistors having a gate terminal controlled by said latch output node;
    at least one inverter circuit separate from said at least one pair of memory elements; and
    a pull down circuit separate from said inverter circuit and from said at least one pair of memory elements,
wherein the at least one inverter circuit and pull down circuit are operatively coupled to the least one cell to increase read operation performance with low leakage.

2. The Memory device of claim 1, wherein said write access transistor comprises a NMOS transistor having a gate terminal connected to said write word line, a drain terminal connected to said write bit line and a source terminal connected to said latch output node.

3. The Memory device of claim 1, wherein said read access transistor comprises a NMOS transistor having a gate terminal connected to said latch output node of said memory element, a drain terminal connected to said read bit line and source terminal connected to said local drive line.

4. The Memory device of claim 1, wherein said inverter comprises a PMOS transistor and an NMOS transistor.

5. The Memory device of claim 1, wherein said pull down circuit comprises at least one NMOS transistor having a drain terminal connected to said inverter, a source terminal connected to a ground voltage, and a gate terminal receiving a leakage control signal to reduce said leakages during inactive mode of said memory by turning off said NMOS of the pull down circuit.

6. A method of providing a high speed read operation and a low leakage in a dual port static random access memory (SRAM), said method comprising the steps of:
creating a bi-stable circuit in a pair of memory element for storing true and complement logic levels;
writing data with a write access transistor;
reading data with read access transistor having a source terminal connected to an inverter circuit separate from said pair of memory elements for the high speed read operation; and
controlling a leakage with a leakage control signal, said signal being applied to a pull down circuit separate from said inverter circuit and from said pair of memory elements during an inactive mode of a memory cell.

7. The method of claim 6, wherein said writing comprises:
applying a signal to a drain terminal of said write access transistor with a write bit line; and
enabling a gate terminal of the write access transistor with a write word line to write in a cell.

8. The method of claim 6, wherein said reading comprises:
generating a local ground signal for sharing between the read access transistors; and
reading the data across read bit lines, said bit lines being connected to said read access transistor.

9. A dual port static random access memory (SRAM) having dedicated read and write ports to provide a high speed read operation with a low leakage comprising:
a plurality of SRAM arrays;
a local ground line coupled to the SRAM arrays;
a read word line coupled to the SRAM arrays;
an inverter circuit separate from said plurality of SRAM arrays and coupled to the local ground line and the read word line; and
a pulldown circuit separate from said inverter circuit and from said plurality of SRAM arrays having an input for receiving a control signal and an output coupled to the inverter circuit.

10. The memory of claim 9 wherein the SRAM arrays receive an SRAM implant.

11. The memory of claim 9 wherein the inverter circuit receives a logic implant.

12. The memory of claim 9 wherein the pulldown circuit receives a logic implant.

13. The memory of claim 9 wherein the inverter circuit comprises a P-channel transistor and an N-channel transistor.

14. The memory of claim 13 wherein the P-channel transistor comprises a source coupled to a source of supply voltage, a gate coupled to the read word line, and a drain coupled to the local ground line.

15. The memory of claim 13 wherein the N-channel transistor comprises a source coupled to the pulldown circuit, a gate coupled to the read word line, and a drain coupled to the local ground line.

16. The memory of claim 9 wherein the pulldown circuit comprises an N-channel transistor.

17. The memory of claim 16 wherein the N-channel transistor comprises a source coupled to ground, a gate for receiving the control signal, and a drain coupled to the inverter circuit.

18. The memory of claim 9 wherein the control signal comprises a leakage control signal.

19. The memory of claim 18 wherein the leakage control signal is applied to the pulldown circuit during an inactive mode.

20. The memory of claim 9 wherein each of the plurality of SRAM arrays comprise a plurality of cross-coupled SRAM memory cells.

* * * * *

UNITED STATES PATENT AND TRADEMARK OFFICE
CERTIFICATE OF CORRECTION

PATENT NO.          : 7,813,161 B2
APPLICATION NO.  : 11/847119
DATED                    : October 12, 2010
INVENTOR(S)         : Yogesh Luthra It is certified that error appears in the above-identified patent and that said Letters Patent is hereby corrected as shown below:

Column 7, line 7, "element" should be --elements--

Signed and Sealed this

Twenty-first Day of December, 2010

David J. Kappos
*Director of the United States Patent and Trademark Office*